United States Patent

Bui-Le et al.

Patent Number: 6,083,844
Date of Patent: *Jul. 4, 2000

[54] TECHNIQUES FOR ETCHING AN OXIDE LAYER

[75] Inventors: Giao Quynh Bui-Le, Santa Clara; John Arima, Fremont, both of Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/996,071

[22] Filed: Dec. 22, 1997

[51] Int. Cl.[7] .................. H01L 21/311; H01L 21/465; C23F 1/02
[52] U.S. Cl. .................. 438/720; 438/711; 216/67
[58] Field of Search .................. 438/710, 711, 438/720; 216/58, 63, 67; 156/345

[56] References Cited

U.S. PATENT DOCUMENTS

| | | | |
|---|---|---|---|
| 5,248,371 | 9/1993 | Maher et al. | 156/345 |
| 5,269,879 | 12/1993 | Rhoades et al. | 156/643 |
| 5,462,896 | 10/1995 | Komura et al. | 437/228 |
| 5,596,431 | 1/1997 | Bongaerts et al. | 349/32 |
| 5,658,425 | 8/1997 | Halman et al. | 438/620 |
| 5,698,070 | 12/1997 | Hirano et al. | 156/643.1 |
| 5,817,579 | 10/1998 | Ko et al. | 438/740 |

FOREIGN PATENT DOCUMENTS

| | | | |
|---|---|---|---|
| 0805485A2 | 11/1997 | European Pat. Off. | H01L 21/311 |
| 05013593 | 1/1993 | Japan | H01L 21/90 |
| 09167757 | 6/1997 | Japan | H01L 21/3065 |

OTHER PUBLICATIONS

Li, et al., "Selective reactive ion etching of silicon nitride over silicon using $CHF_3$ with $N_2$ addition", Sep./Oct. 1995, Journal of vacuum Science & Technology B, pp. 2008–2012.

International Search Report, EPO, Jul. 4, 1999.

Primary Examiner—Richard Bueker
Assistant Examiner—Alva C Powell
Attorney, Agent, or Firm—Beyer Weaver & Thomas, LLP

[57] ABSTRACT

A method for etching a substrate having thereon a silicon dioxide-containing layer disposed above a TiN layer is disclosed. The method includes positioning the substrate in the plasma processing chamber. There is also included flowing an etchant source gas that includes CO, $CHF_3$, neon and $N_2$ into the plasma processing chamber. Further, there is included forming a plasma out of the etchant source gas within the plasma processing chamber to cause etching of the silicon-dioxide-containing layer.

34 Claims, 3 Drawing Sheets

TECHNIQUES FOR ETCHING AN OXIDE LAYER

BACKGROUND OF THE INVENTION

The present invention relates to the fabrication of semiconductor integrated circuits (IC's) and flat panel displays. More particularly, the present invention relates to improved methods and apparatus for etching through the silicon dioxide-containing layer of a substrate during semiconductor device fabrication.

In the fabrication of semiconductor devices, different layers may be deposited, patterned, and etched to form the desired structures on the substrate (i.e., a glass panel or a semiconductor wafer). In some semiconductor devices, titanium nitride (TiN) is often employed as an etch stop layer during the etching of an overlying silicon dioxide-containing layer or as an antireflective coating (ARC) layer. By way of example, when the TiN layer is employed under a silicon dioxide-containing layer, such as a PETEOS (plasma enhanced tetraethylorthosilicate), BSG (boron-doped silicate glass), USG (undoped silicate glass), BPSG (borophosphosilicate glass), or the like, the TiN material may serve as an etch stop during a via etch through the silicon dioxide-containing layer. Thereafter, the TiN material may serve as a barrier or glue material between the subsequently deposited tungsten or aluminum plugs and any underlying metal layer (e.g., copper or aluminum).

To facilitate discussion, FIG. 1 illustrates a cross section view of some exemplary layers of a substrate. With reference to the figures herein, it should be noted that other additional layers above, below, or between the layers shown may be present. Further, not all of the shown layers need necessarily be present and some or all may be substituted by other different layers. In FIG. 1, there is shown an underlying layer 102, representing any layer or layers that may underlie a TiN layer on a substrate. For example, underlying layer 102 may represent the substrate itself or may represent layers subsequently deposited and etched prior to the deposition of a TiN layer 104. TiN layer 104 is shown disposed between underlying layer 102 and a subsequently deposited silicon dioxide-containing layer 106. Although the layers of FIG. 1 have not been shown to scale to facilitate ease of illustration, TiN layer 104 is typically much thinner than silicon dioxide-containing layer 106.

In some cases, it is often desirable to etch through silicon dioxide-containing layer 106 down to the interface between silicon dioxide-containing layer 106 and TiN layer 104 without etching completely through TiN layer 104. In these cases, TiN layer 104 may function as the etch stop layer, i.e., it is desirable that the etching stops before TiN layer 104 is etched through. As semiconductor devices density increases over time, however, it becomes increasingly difficult to etch, using prior art etch techniques, through silicon dioxide-containing layer 106 without damaging underlying TiN layer 104. This is because the TiN layer is typically quite thin in modern high density semiconductor devices since a thinner TiN layer is more conducive to the manufacture of high density devices.

In the prior art, the etching of the oxide layer (i.e., the silicon dioxide-containing layer) was typically accomplished using a $C_XF_Y$ chemistry (e.g., $CF_4$, $C_2F_6$, $C_3F_8$, or the like ). The $C_XF_Y$ chemistry was selected primarily for its high etch rate through the oxide layer. By way of example, the prior art $C_XF_Y$ chemistry typically etches through the oxide layer at a rate of greater than about 2,000 angstrom per minute. Unfortunately, the $C_XF_Y$ chemistry has a relatively low selectivity toward TiN. That is, the prior art $C_XF_Y$ chemistry also etches the TiN material at a relatively significant etch rate. For example, the $C_XF_Y$ chemistry typically has an oxide-to-TiN selectivity in the range of 7 to 1 to 10 to 1 (i.e., the $C_XF_Y$ etches through the oxide material 7 to 10 times as fast as it etches through the TiN material).

In FIG. 2, a trench 108 is etched through silicon dioxide-containing layer 106. TiN layer 104 is intended as the etch stop layer and should have stopped the oxide etch before the oxide etch proceeds through to underlying layer 102. Nevertheless, the low TiN selectivity of the prior art chemistry causes TiN layer 104 of FIG. 2, which is quite thin to enable the semiconductor devices to pack closely together, to be completely etched through under trench 108. When the TiN layer is inadvertently etched through, the bottom of trench 108 may present an irregular topology to subsequent processes, which may cause the fabricated devices to fail due to, for example, unintended misalignment of layers. Further, the absence of the TiN barrier material at the bottom of the trench may cause ion leakage and/or other unintended electrical characteristics in the fabricated devices. In a typical situation, TiN layer 104 may be etched through either during the main oxide etch step or during the oxide over-etch step.

The low oxide-to-TiN selectivity of the prior art $C_XF_Y$ chemistry also poses significant problems during the etching of multi-level oxide layers. To facilitate discussion, FIG. 3 depicts a multi-level oxide structure 300, including a multi level oxide layer 302. For illustration purposes, multi-level oxide layer 302 includes a thick region 304 and a thin region 306 although other regions of various thicknesses may also be present within multi-level oxide layer 302. Multi-level oxide layer 302 is disposed on TiN layer 104, which is intended to function as an etch stop during the etching of multi-level oxide layer 302. For consistency, underlying layer 102 is also shown disposed below TiN layer 104.

In some cases, it may be desirable to simultaneously create vias in thick region 304 and thin region 306 of multi-level oxide layer 302. Since thin region 306 is thinner than thick region 304, via etching in thin region 306 may be completed before the oxide material in thick region 304 is completely etched through. If the oxide etch is allowed to continue to facilitate etching of the via in thick region 304, the low oxide-to-TiN selectivity of the prior art $C_XF_Y$ chemistry may undesirably etch through the TiN material within the via in thin region 306.

On the other hand, if the oxide etch step is shortened to prevent damage to the TiN material underneath the via in thin region 306, the via through thick region 304 of multi-level oxide layer 302 may not be completely etched through. As is apparent, the low oxide-to-TiN selectivity of the prior art chemistry poses serious problems while etching multi-level oxide layers of modern high density ICs.

In view of the foregoing, there are desired improved techniques for etching through the oxide layer during the manufacture of semiconductor devices. The improved techniques preferably provide a high oxide-to-TiN selectivity to substantially reduce damage to the underlying TiN layer during oxide etching.

SUMMARY OF THE INVENTION

The invention relates, in one embodiment, to a method for etching a substrate in a plasma processing chamber. The substrate has thereon a silicon dioxide-containing layer disposed above a TiN layer. The method includes positioning the substrate in the plasma processing chamber. There is also included flowing an etchant source gas that includes CO, $CHF_3$, neon and $N_2$ into the plasma processing chamber. Further, there is included forming a plasma out of the etchant source gas within the plasma processing chamber to cause etching of the silicon-dioxide-containing layer.

In another embodiment, the invention relates to a method for preventing damage to an underlying TiN layer while etching a multi-level silicon dioxide-containing layer in a plasma processing chamber. The multi-level silicon dioxide-containing layer is disposed above the TiN layer on a substrate. The multi-level silicon dioxide-containing layer includes a thin region and a thick region. The method includes forming a photoresist mask above the multi-level silicon-dioxide containing layer. The photoresist mask has therein a first via opening above the thin region and a second via opening above the thick region.

The method further includes disposing the substrate, including the photoresist mask, in the plasma processing chamber. There is also included flowing an etchant source gas that includes CO, $CHF_3$, neon and $N_2$ into the plasma processing chamber. Additionally, there is included providing power to electrodes of the plasma processing chamber to form a plasma out of the etchant source gas, thereby causing etching of the multi-level silicon dioxide-containing layer through the first via opening and the second via opening. During etching, the flow rates of the CO, the $CHF_3$, the neon and the $N_2$ are configured to permit the multi-level silicon dioxide-containing layer to be completely etched through in the thick region without damaging the TiN layer under the thin region of the multilevel silicon dioxide-containing layer.

In yet another embodiment, the invention relates to a method for forming an integrated circuit. The method includes providing a semiconductor wafer having thereon a silicon dioxide-containing layer disposed above a TiN layer. There is also included positioning the semiconductor wafer in a plasma processing chamber. Additionally, there is included flowing an etchant source gas that includes CO, $CHF_3$, neon and $N_2$ into the plasma processing chamber. Further, there is included forming a plasma out of the etchant source gas within the plasma processing chamber to cause etching of the silicon-dioxide-containing layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, the aforementioned TiN damage issue is substantially alleviated by etching the oxide layer (i.e., the silicon dioxide-containing layer) with a novel chemistry that includes CO, $CHF_3$, neon and $N_2$ in a plasma processing system. In a preferred embodiment, the inventive chemistry is employed to etch through the oxide layer in a triode-type plasma processing system such as the Lam 9500™ plasma processing system available from Lam Research Corp. of Fremont, Calif. However, it is contemplated that the inventive oxide etch technique, using the inventive $CO/CHF_3/neon/N_2$ chemistry, may be performed in any of the known plasma processing apparatuses including, but not limited to, those adapted for dry etching, plasma etching, reactive ion etching, magnetically enhanced reactive ion etching, electron cyclotron resonance etching, or the like. Note that the this is true irrespective of whether energy to the plasma is delivered through capacitively coupled parallel electrode plates, through ECR microwave plasma sources, or through inductively coupled RF sources such as helicon, helical resonators, and transformer coupled sources (either planar or non-planar). These processing systems, among others, are readily available commercially from a number of vendors including the aforementioned Lam Research Corp.

Figure 1:
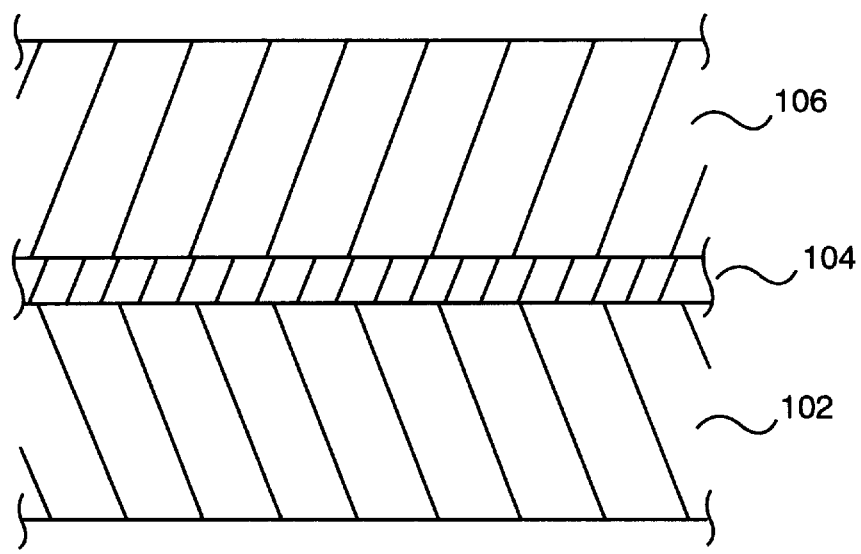
FIG. 1 illustrates a cross section view of some exemplary layers of a substrate, including the silicon dioxide-containing layer and the underlying TiN layer.
Figure 2:
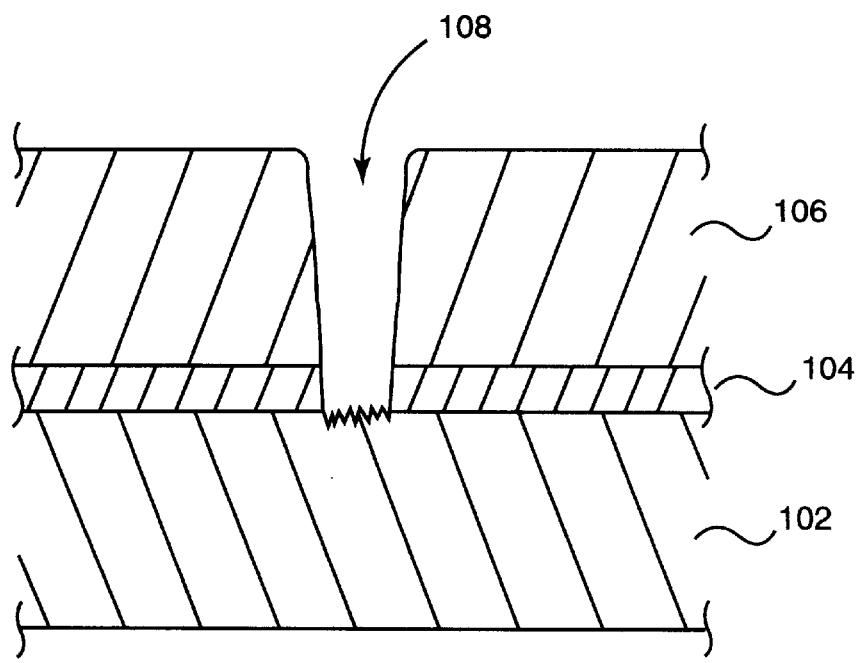
In FIG. 2, a trench is etched through silicon dioxide-containing layer of FIG. 1.
Figure 3:
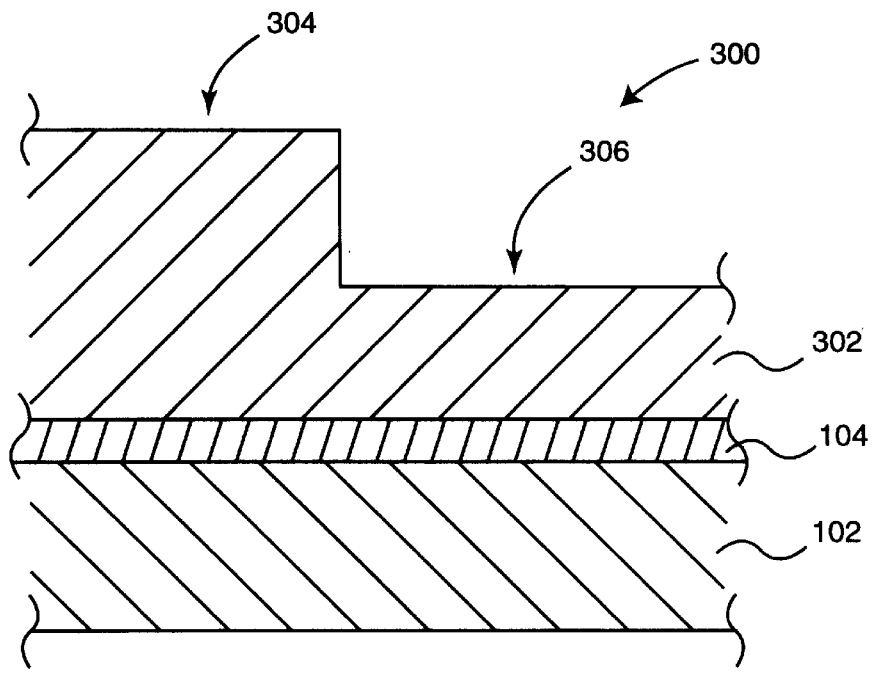
FIG. 3 depicts an exemplary multi-level oxide structure, including a multi level oxide layer.
Figure 4:
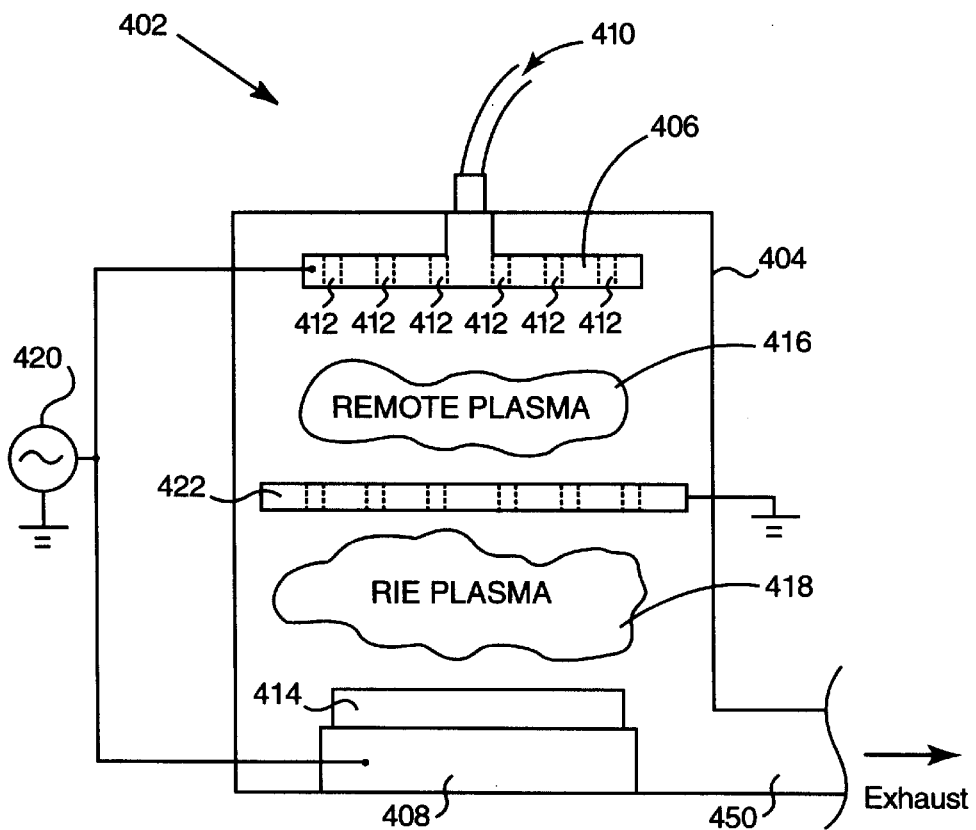
FIG. 4 illustrates a triode-type plasma processing system, representing a plasma processing system suitable for use with the inventive $CO/CHF_3/neon/N_2$ oxide etch technique.

To facilitate discussion, FIG. 4 illustrates a triode-type plasma processing system 402, representing a plasma processing system suitable for use with the inventive $CO/CHF_3/neon/N_2$ oxide etch technique. Referring now to FIG. 4, triode-type plasma processing system 402 includes a chamber 404. Within chamber 404, there is disposed an upper electrode 406 and a lower electrode 408. In the embodiment of FIG. 4, upper electrode 406 represents a combination electrode/gas distribution plate mechanism through which etchant source gases entering through port 410 is distributed into chamber 404 through apertures 412.

Above lower electrode 408, there is disposed a substrate 414, representing, for example, a glass panel or a semiconductor wafer having thereon an oxide layer to be etched. Upper electrode 406 and lower electrode 408 are powered by an RF power source 420, which provides radio frequency (RF) power to the electrodes via appropriate matching and/or capacitive blocking networks (conventional and not shown to simplify the illustration). In one embodiment, the frequency range of RF power source 420 is about 13.56 MEz although other suitable RF frequency ranges may also be employed.

Between upper electrode 406 and substrate 414, there is disposed a grounded anode 422. In embodiment of FIG. 4, grounded anode 422 represents a grounded hollow anode, i.e., a grounded grid having therein a plurality of apertures or aberrations. During plasma etching, grounded anode 422 helps improve the etch uniformity on substrate 414 by more uniformly distributing the ions over the surface of substrate 414.

To prepare for oxide etching, substrate 414 having thereon an oxide layer disposed above a TiN layer is introduced into chamber 404 and positioned on top of lower electrode 408. The inventive CO/C HF$_3$/Neon/N$_2$ etchant source gas is then flowed through port 410. When RF power is supplied to upper electrode 406 and lower electrode 408, a remote plasma cloud 416 is struck in between upper electrode 406 and the grounded anode 422, and a reactive ion etching (RIE) plasma cloud 418 is ignited within the region between grounded anode 422 and substrate 414 to etch the exposed surface of substrate 414. The reaction creates volatile byproducts, which are then exhausted away through exhaust port 450. The oxide etch step ends after a predetermined time has elapsed or when an appropriate monitoring apparatus (such as an optical wavelength monitor) detects that the oxide material has been etched through.

While not wishing to be bound by theory, it is believed that the formation of titanium oxide over the TiN surface contributes to the high oxide-to-TiN selectivity of the inventive CO/CHF$_3$/Neon/N$_2$ oxide etching technique. The titanium oxide is believed to be formed as CO reacts with TiN. Alternatively or additionally, it is believed that the reactions between CHF$_3$, CO$_2$, COF$_2$ and SiF$_4$ generate CF$_2$, CF$_X$, and CHF$_X$ polymers. Some of the polymers formed (believed to be fluorocarbon or hydrofluorocarbon) may block the etching of the underlying TiN layer during oxide etching. When so blocked, TiN erosion is retarded to a significant degree. Alternatively or additionally, it is believed that as the oxide material is removed in the via and the TiN material is exposed to the reactive species, titanium will be sputtered onto the side walls of the via and catalyze the formation of polymer to block TiN etching. Alternatively or additionally, neon is believed to play a role in controlling the RIE lag (i.e., reducing the disparity in the etch rate in the open region of the substrate versus the etch rate in the narrow region). N$_2$ is believed to help remove polymer residues and is also believed to play a role in RIE lag control.

EXAMPLES

In one example, an 8-inch wafer having thereon a 600 angstroms thick layer of TiN and a multi-level PETEOS layer of 7,000 angstroms thick and 14,000 angstroms thick is disposed in the aforementioned Lam 6500™ plasma processing system. Table 1 illustrates the approximate parameters for use in the oxide main etch step while etching through the oxide layer on the sample wafer.

TABLE 1

|  | Suitable Range | Preferred Range | Preferred Value |
| --- | --- | --- | --- |
| Time (seconds) | 80–120 | 90–110 | 100 |
| CHF$_3$ flow (sccm) | 35–65 | 45–55 | 50 |
| CO flow (sccm) | 25–45 | 30–40 | 35 |
| Neon flow (sccm) | 180–220 | 190–210 | 200 |
| N$_2$ flow (sccm) | 20–40 | 25–35 | 30 |
| Upper Electrode Temp (° C.) | 15–25 | 18–22 | 20 |
| Lower Electrode Temp (° C.) | 8–16 | 10–14 | 12 |
| Power (Watts) | 400–700 | 500–600 | 550 |
| Pressure (mTorr) | 125–175 | 140–160 | 150 |

Table 2 illustrates the approximate parameters for use in the oxide over-etch step while etching through the oxide layer on the sample wafer.

TABLE 2

|  | Suitable Range | Preferred Range | Preferred Value |
| --- | --- | --- | --- |
| Time (seconds) | 80–120 | 90–110 | 100 |
| CHF$_3$ flow (sccm) | 20–40 | 25–35 | 30 |
| CO flow (sccm) | 40–70 | 50–60 | 55 |
| Neon flow (sccm) | 180–220 | 190–210 | 200 |
| N$_2$ flow (sccm) | 20–40 | 25–35 | 30 |
| Upper Electrode Temp (° C.) | 15–25 | 18–22 | 20 |
| Lower Electrode Temp (° C.) | 8–16 | 10–14 | 12 |
| Power (Watts) | 400–700 | 500–600 | 550 |
| Pressure (mTorr) | 125–175 | 140–160 | 150 |

Figure 5:
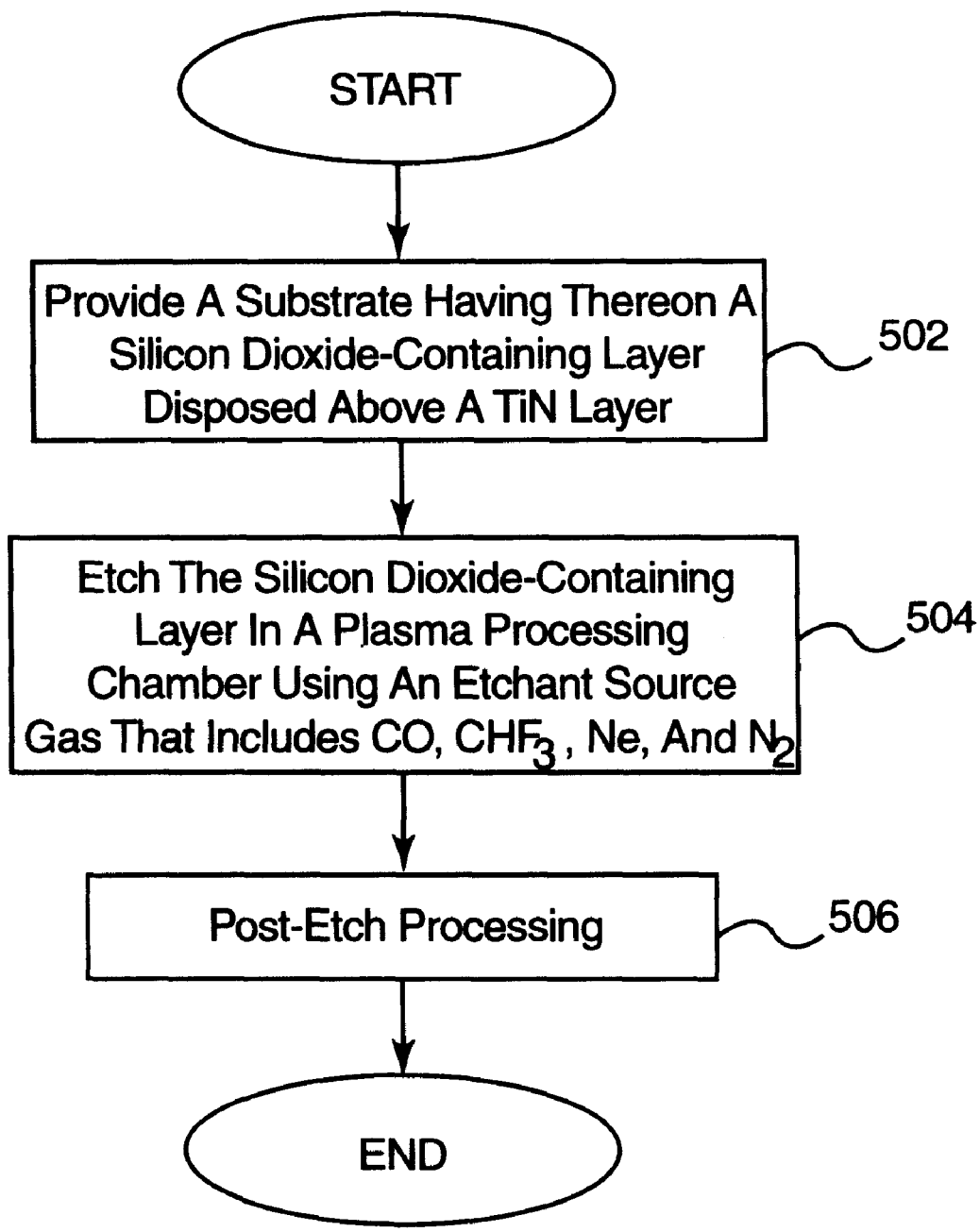
FIG. 5 illustrates, in accordance with one embodiment of the present invention, the steps involved in etching a substrate having thereon an oxide layer disposed above a TiN layer.

FIG. 5 illustrates, in accordance with one embodiment of the present invention, the steps involved in etching a substrate having thereon an oxide layer disposed above a TiN layer. In step 502, a substrate having thereon an oxide layer disposed above a TiN layer is provided and positioned within the plasma processing chamber. In step 504, the oxide layer is etched using the inventive CO/CHF$_3$/neon/N$_2$ chemistry of the present invention. In one embodiment, the parameters employed in step 504 is substantially similar to those disclosed in Tables 1 and 2. However, the disclosed parameters may be optimized and/or varied to suit the requirements of a particular substrate size, a particular oxide layer (both in composition and in thickness), a particular TiN layer (both in composition and thickness) and/or a specific plasma processing system.

In step 506, the substrate may undergo additional processing steps that are conventional in nature. Thereafter, the finished substrate may be processed into dies which may then be made into IC chips or processed to form a flat panel display. The resulting IC chip(s) or flat panel display(s) may then be incorporated into an electronic device, e.g., any of the well known commercial or consumer electronic devices, including digital computers.

The inventive CO/CHF$_3$/neon/N$_2$ oxide etch chemistry advantageously yields, in the experiments conducted, a high oxide-to-TiN selectivity relative to prior art C$_X$F$_Y$ chemistry.

Scanning electron microscope (SEM) photographs reveal that the oxide-to-TiN selectivity may be greater than about 50 to 1 or even greater than about 60 to 1. This is a significant improvement over the typical 7 to 1 to 10 to 1 oxide-to-TiN selectivity observed when the prior art $C_XF_Y$ chemistry is employed.

Further, analysis of SEM photographs reveals that the high oxide-to-TiN selectivity is achieved without compromising proper etch profile, critical dimension (CD) control, RIE lag, selectivity to photoresist, and/or residue control. As can be appreciated by those skilled in the art, the underlying TiN layer is advantageously protected during the oxide etching process due to the high oxide-to-TiN selectivity. Further, the high oxide-to-TiN selectivity advantageously permits a high degree of over-etch during the oxide etch step. The ability to perform an extended over-etch is advantageous in etching a multi-level oxide layer since it preserves the TiN material within the via in the thin oxide region while allowing the oxide material in the thick region of the multi-level oxide layer to be completely etched through.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching a substrate in a plasma processing chamber and providing a high oxide-to-TiN selectivity, said substrate having thereon a silicon dioxide-containing layer disposed above a TiN layer, said method comprising:

positioning said substrate in said plasma processing chamber;

flowing an echant source gas that includes CO, $CHF_3$, neon and $N_2$ into said plasma processing chamber, whereby a layer of titanium oxide is formed over the surface of the TiN layer by the reaction of the CO with the TiN, the titanium oxide contributing to the high oxide-to-TiN selectivity in association with the etchant source gas; and forming a plasma out of said etchant source gas within said plasma processing chamber to cause etching of said silicon-dioxide-containing layer.

2. The method of claim 1 wherein said substrate is a semiconductor wafer.

3. The method of claim 1 wherein said substrate is a glass panel.

4. The method of claim 1 wherein said silicon dioxide-containing layer represents a tetraethylorthosilicate (TEOS) layer.

5. The method of claim 1 wherein said etchant source gas consists essentially of CO, $CHF_3$, neon and $N_2$.

6. The method of claim 5 wherein a flow ratio of said $CHF_3$ to said CO is about 1.1 to 1.8.

7. The method of claim 5 wherein a flow ratio of said $CHF_3$ to said neon is about 0.2 to 0.3.

8. The method of claim 5 wherein a flow ratio of said $CHF_3$ to said $N_2$ is about 1.5 to 2.0.

9. The method of claim 5 wherein said plasma processing chamber represents a triode-type plasma processing chamber having therein a grounded hollow anode.

10. The method of claim 1 wherein said substrate represents a substrate for forming integrated circuits (ICs).

11. The method of claim 1, wherein the reactions between the CO, $CHF_3$, neon and $N_2$ generate $CF_2$, $CF_x$, and $CHF_x$ polymers.

12. The method of claim 11, wherein the polymers formed include fluorocarbon or hydrofluorocarbon.

13. The method of claim 11, wherein the polymers block the etching of the underlying TiN layer during oxide etching.

14. The method of claim 1, wherein as the oxide material is removed in a via and the TiN material is exposed to a reactive species, titanium is sputtered onto the side walls of the via and serves to catalyze the formation of polymer-to-TiN etching.

15. A method for preventing damage to an underlying TiN layer while etching a multi-level silicon dioxide-containing layer in a plasma processing chamber and providing a high oxide-to-TiN selectivity, said multi-level silicon dioxide-containing layer being disposed above said TiN layer on a substrate, said multi-level silicon dioxide-containing layer including a thin region and a thick region, said method comprising:

forming a photoresist mask above said multi-level silicon-dioxide containing layer, said photoresist mask having therein a first via opening above said thin region and a second via opening above said thick region;

disposing said substrate, including said photoresist mask, in said plasma processing chamber;

flowing an etchant source gas that includes CO, $CHF_3$, neon and $N_2$ into said plasma processing chamber, whereby a layer of titanium oxide is formed over the surface of the TiN layer by the reaction of the CO with the TiN, the titanium oxide contributing to the high oxide-to-TiN selectivity in association with the etchant source gas; and providing power to electrodes of said plasma processing chamber to form a plasma out of said etchant source gas, thereby causing etching of said multi-level silicon dioxide-containing layer through said first via opening and said second via opening, flow rates of said CO, said $CHF_3$, said neon and said $N_2$ being configured permit said multi-level silicon dioxide-containing layer to be completely etched through in said thick region without damaging said TiN layer under said thin region of said multi-level silicon dioxide-containing layer.

16. The method of claim 15 wherein said etchant source gas consists essentially of CO, $CHF_3$, neon and $N_2$.

17. The method of claim 16 wherein a flow ratio of said $CHF_3$ to said CO is about 0.4 to 0.6.

18. The method of claim 16 wherein a flow ratio of said $CHF_3$ to said neon is about 0.1 to 0.2.

19. The method of claim 16 wherein a flow ratio of said $CHF_3$ to said $N_2$ is about 0.8 to 1.4.

20. The method of claim 16 wherein said plasma processing chamber represents a triode-type plasma processing chamber having therein a grounded hollow anode.

21. The method of claim 15 wherein said substrate is a semiconductor wafer.

22. The method of claim 15 wherein said silicon dioxide-containing layer represents a tetraethylorthosilicate (TEOS) layer.

23. The method of claim 15 wherein said substrate represents a substrate for forming integrated circuits (ICs).

24. The method of claim 15 wherein said substrate represents a substrate for forming a flat panel display.

25. The method of claim 15, wherein the reactions between the CO, $CHF_3$, neon and $N_2$ generate $CF_2$, $CF_x$, and $CHF_x$ polymers.

26. The method of claim 25, wherein the polymers formed include fluorocarbon or hydrofluorocarbon.

27. The method of claim 25, wherein the polymers block the etching of the underlying TiN layer during oxide etching.

28. The method of claim 15, wherein as the oxide material is removed in a via and the TiN material is exposed to a reactive species, titanium is sputtered onto the side walls of the via and serves to catalyze the formation of polymer-to-TiN etching.

29. A method for forming an integrated circuit, comprising:

providing a semiconductor wafer having thereon a silicon dioxide-containing layer disposed above a TiN layer;

positioning said semiconductor wafer in a plasma processing chamber;

flowing an etchant source gas that includes CO, $CHF_3$, neon and $N_2$ into said plasma processing chamber, whereby a layer of titanium oxide is formed over the surface of the TiN layer by the reaction of the CO with the TiN, the titanium oxide contributing to a high oxide-to-TiN selectivity in association with the etchant source gas; and forming a plasma out of said etchant source gas within said plasma processing chamber to cause etching of said silicon-dioxide-containing layer.

30. The method of claim 29 wherein said etchant source gas consists essentially of CO, $CHF_3$, neon and $N_2$.

31. The method of claim 29, wherein the reactions between the CO, $CHF_3$, neon and $N_2$ generate $CF_2$, $CF_x$, and $CHF_x$ polymers.

32. The method of claim 31, wherein the polymers formed include fluorocarbon or hydrofluorocarbon.

33. The method of claim 31, wherein the polymers block the etching of the underlying TiN layer during oxide etching.

34. The method of claim 29, wherein as the oxide material is removed in a via and the TiN material is exposed to a reactive species, titanium is sputtered onto the side walls of the via and serves to catalyze the formation of polymer-to-TiN etching.

* * * * *